(12) United States Patent
Holaday et al.

(10) Patent No.: US 10,670,632 B2
(45) Date of Patent: Jun. 2, 2020

(54) ANALOG TRANSITIONAL STORAGE

(71) Applicant: Tektronix, Inc., Beaverton, OR (US)

(72) Inventors: David A. Holaday, Cornelius, OR (US); Joshua J. O'Brien, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 62 days.

(21) Appl. No.: 15/952,547

(22) Filed: Apr. 13, 2018

(65) Prior Publication Data
US 2018/0299491 A1   Oct. 18, 2018

Related U.S. Application Data

(60) Provisional application No. 62/485,684, filed on Apr. 14, 2017.

(51) Int. Cl.
| | | |
|---|---|---|
| *G01R 13/02* | (2006.01) | |
| *G01R 13/20* | (2006.01) | |
| *G11C 29/56* | (2006.01) | |
| *G01R 13/34* | (2006.01) | |
| *G11C 29/52* | (2006.01) | |
| *G11C 27/02* | (2006.01) | |

(52) U.S. Cl.
CPC ......... *G01R 13/0254* (2013.01); *G01R 13/02* (2013.01); *G01R 13/0272* (2013.01); *G01R 13/20* (2013.01); *G01R 13/34* (2013.01); *G01R 13/345* (2013.01); *G11C 29/56* (2013.01); *G11C 27/02* (2013.01); *G11C 29/52* (2013.01)

(58) Field of Classification Search
CPC .................................................. G01R 13/0272
See application file for complete search history.

(56) References Cited

U.S. PATENT DOCUMENTS

| | | |
|---|---|---|
| 4,523,289 A | 6/1985 | Soma et al. |
| 4,586,022 A | 4/1986 | Acuff |
| 5,548,232 A | 8/1996 | Yamaura et al. |
| 5,798,934 A * | 8/1998 | Saigo .................. G01R 31/367 702/63 |
| 2012/0194169 A1 | 8/2012 | Smith et al. |
| 2013/0231882 A1 | 9/2013 | Yu |

OTHER PUBLICATIONS

EESR—European Patent Office, Extended European Search Report and Written Opinion for European Application 18167110.8, dated Sep. 14, 2018, 8 pages, Munich, Germany.

* cited by examiner

*Primary Examiner* — Jas A Sanghera
(74) *Attorney, Agent, or Firm* — Miller Nash Graham & Dunn; Andrew J. Harrington

(57) ABSTRACT

A test and measurement instrument can include an input to receive an analog signal, a sampler to produce digital sample data corresponding to the analog signal, a buffer to store a portion of the sample data, a memory to store sample data from the buffer, a plurality of comparators to establish a vertical range, and a controller configured to configure the plurality of comparators to establish a first vertical range based on sample data in the buffer, and determine whether any of the sample data in the buffer transitions outside the first vertical range during a period of time.

20 Claims, 6 Drawing Sheets

=== PAGE 1 ===
ANALOG TRANSITIONAL STORAGE

CROSS-REFERENCE TO RELATED APPLICATION

This application claims the benefit of U.S. Provisional Application Ser. No. 62/485,684, titled "ANALOG TRANSITIONAL STORAGE" and filed on Apr. 14, 2017, the content of which is hereby fully incorporated by reference herein.

TECHNICAL FIELD

Embodiments of the disclosed technology generally relate to electrical test and measurement instruments and, in particular, to oscilloscopes.

BACKGROUND

It may be difficult in some situations, e.g., on an oscilloscope, to observe and record a fault of an incoming signal where the cause and effect may be separated by significant periods of time. Various techniques have been attempted to address this problem, all of which have been without success. Attempts to increase the memory size enough to capture the event are often unsuccessful because of the vast amounts of data that are collected at maximum sample rates. A separation of cause and effect greater than 10 seconds is common, which would require an unpractical amount of memory. Further, even when there is enough memory available to capture the events, the amount of data to be processed may itself be unpractical to process in a reasonable amount of time, given the number of sample records that are generated in such a situation.

Attempts to decrease the sample rate of an oscilloscope to capture a longer time period of data have also been unsuccessful because the sample rate is reduced below the amount that is needed to observe the problem. This is exacerbated when the user may not even know what bandwidth he or she will need until the signals in question are observed. Further, the user may have a narrow glitch on a certain signal that is not recognized at a lower sample rate. Attempts to store blocks of samples around multiple trigger events have also largely failed because not all of the important events occur near a defined trigger and may instead occur at other times.

DETAILED DESCRIPTION

Digital oscilloscopes often have digital trigger systems that are used to compare the digitized values from an analog-to-digital converter (ADC) against a threshold to trigger the oscilloscope. Implementations of the disclosed technology generally extend the capabilities of such digital trigger resources to decide when to start and stop the storage of analog signal information during an acquisition, rather than just the beginning and end of the acquisition as is commonly done. For example, once an analog signal acquisition starts, the first sample may be used to load a set of comparators that may be used to detect when future samples cross through the sample level based on a selected offset.

If the sample data stays within the specified vertical range, it may be temporarily stored to a buffer, e.g., a circular buffer, instead of the main acquisition memory. If the sampled analog signal stays within the defined range for more samples than it takes to store a timestamp, however, the buffer may be flushed and the timestamp may be stored to acquisition memory. In certain embodiments, no further samples may be stored until the sampled signal exceeds the defined range. After the analog signal changes such that the signal crosses out of the vertical range, the sample data may be stored normally again.

Implementations of the disclosed technology generally enable a user to store analog signal data on one or more channels only when the signal being digitized is transitioning. In operation, the user may define the analog signal transitioning as a percentage of the vertical range of the digitizer and a length of time. For example, if an analog input signal does not change by more than half of a division in 10 μs, the signal may be deemed to be "not changing" and storage may be paused. Once the analog input signal exceeds the defined vertical limits, however, storage of the sample data may resume. This advantageously allows the user to drastically increase storage time without requiring detailed knowledge about the analog signal being digitized, which allows implementations to be broadly used and not limited to a small subset of conditions.

In certain implementations, comparators such as floating digital window comparators may be used and a gap may be programmed based on an initial ADC code. The minimum length of the gap may be the length of a timestamp, for example. The ADC codes may be stored in a buffer, such as a circular buffer, until the programmable length is reached or a code falls outside of the window comparator. If the programmable buffer length is reached, new sample data may be loaded into the buffer; if, however, an ADC code falls outside of the window comparator, the buffer values may be moved to memory.

Figure 1:
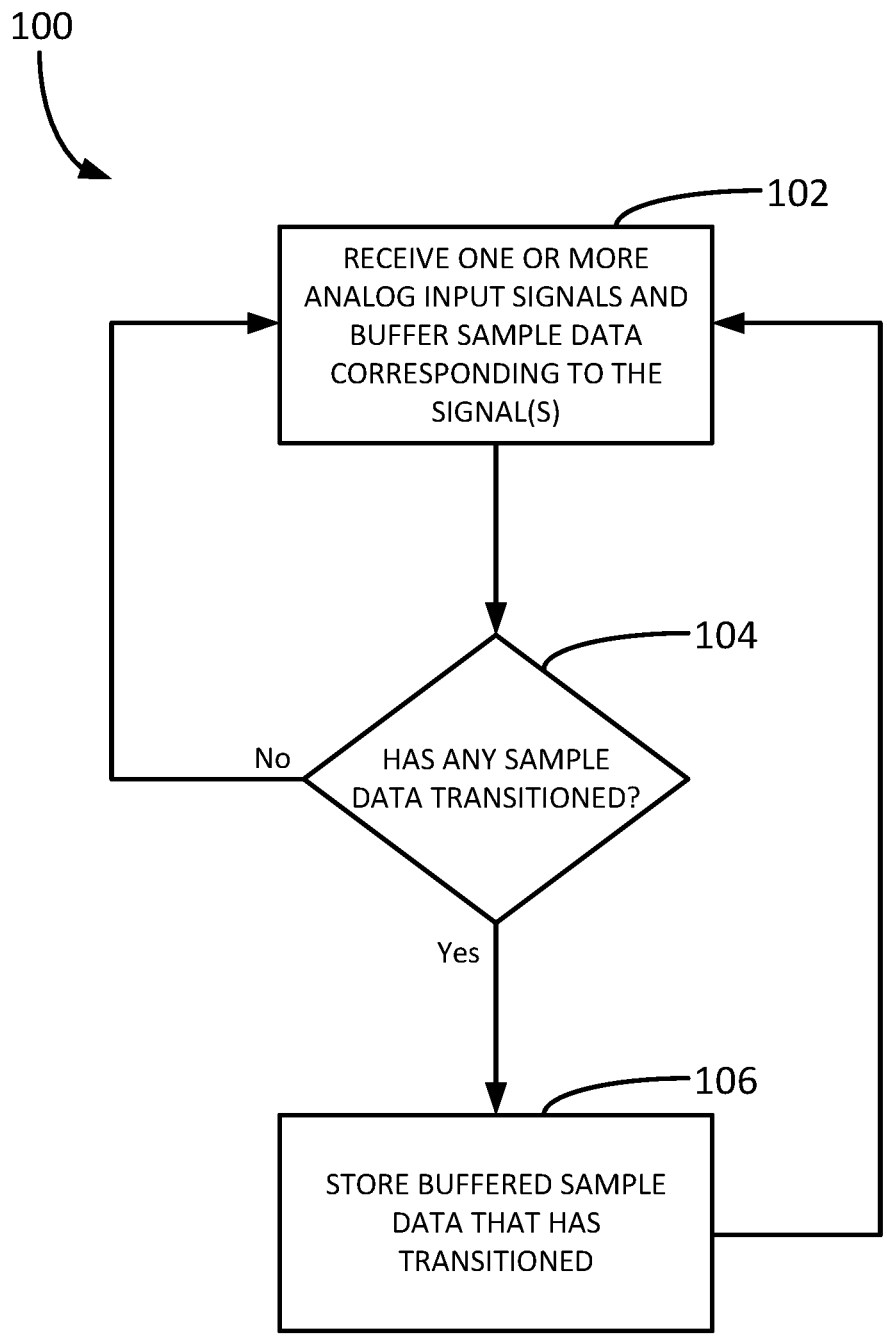
FIG. 1 is a flow diagram illustrating an example of a machine-implemented method for an electronic test and measurement system in accordance with certain implementations of the disclosed technology.

FIG. 1 is a flow diagram illustrating an example of a machine-implemented method 100 for an electronic test and measurement system in accordance with certain implementations of the disclosed technology. At 102, one or more analog input signals are received and sampled by a test and measurement instrument such as an oscilloscope, for example. The analog signal(s) may be received by an input of the test and measurement instrument and sampled by a sampler of the test and measurement instrument. Also at 102, sample data corresponding to the one or more analog input signals is temporarily stored in a buffer, e.g., a circular buffer.

At 104, a determination is made as to whether any of the sample data in the buffer has transitioned. As used herein, the term transition generally refers to a situation in which a magnitude corresponding to an analog input signal has crossed a specified vertical threshold. If no sample data has transitioned, the method 100 returns to 102 and the buffered sample data is disregarded, e.g., not moved to a memory. If any of the buffered sample data has transitioned, however, that sample data is stored, e.g., moved to a memory, as indicated at 106, and the method 100 returns to 102.

Figure 2:
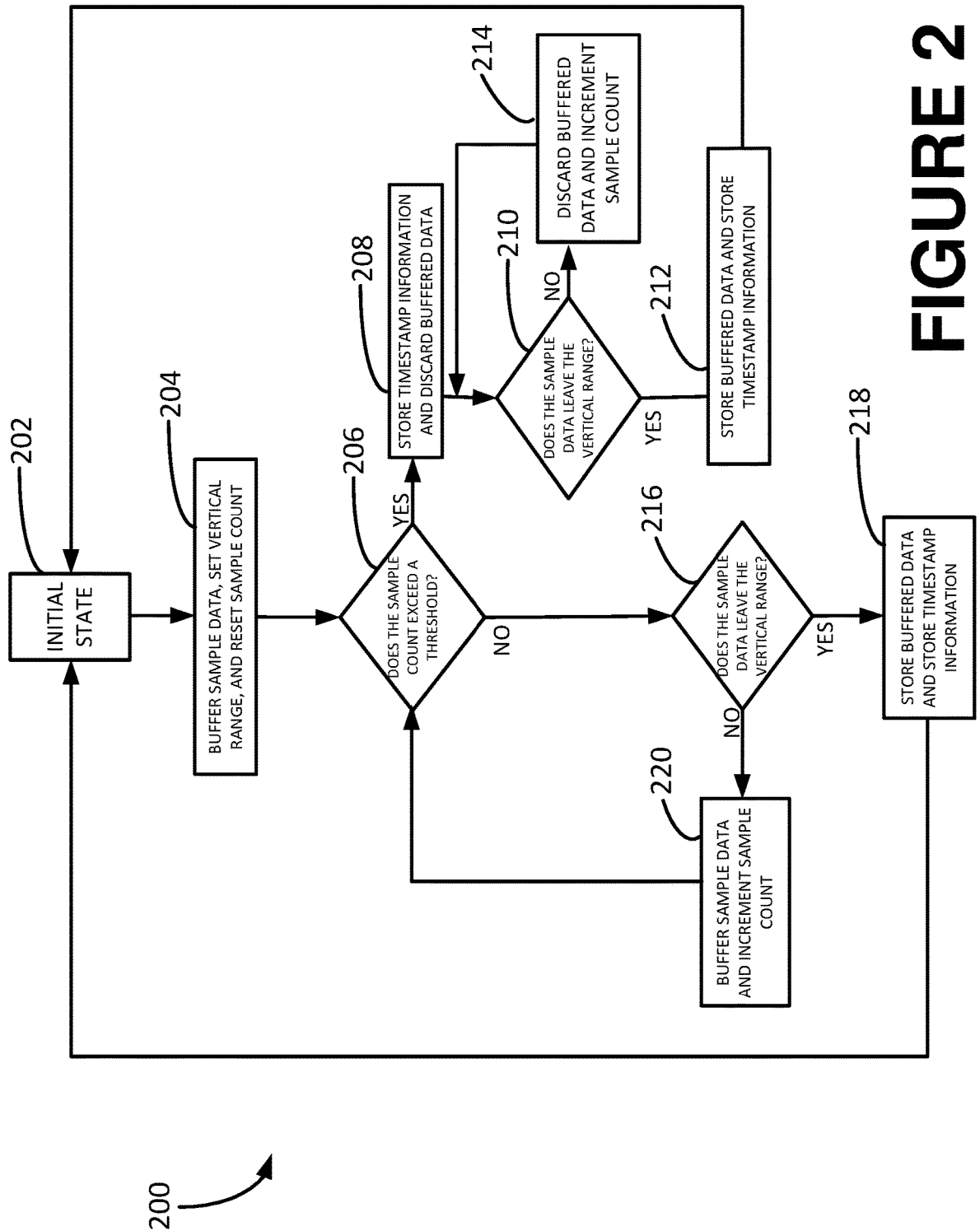
FIG. 2 is a flow diagram illustrating another example of a machine-implemented method for an electronic test and measurement system in accordance with certain implementations of the disclosed technology.

FIG. 2 is a flow diagram illustrating an example of another machine-implemented method 200 for an electronic test and measurement system in accordance with certain implementations of the disclosed technology. At 202, a machine implementing the method is at an initial state, and at least one analog input signal is at an initial value. At 204, the analog input signal(s) is/are sampled, and sample data pertaining to the analog input signal(s) is temporarily stored, e.g., by a buffer such as a circular buffer. Also at 204, a vertical range is established and a sample count is reset, e.g., set to zero. In certain implementations, the vertical range may be established by way of one or more comparators that may each specify a certain vertical threshold, e.g., a defined value that a magnitude corresponding to an analog input signal may cross over a certain period of time.

At 206, a determination is made as to whether the sample count exceeds a certain threshold, e.g., based on the size of the circular buffer. If the sample count exceeds the threshold, the method 200 proceeds to 208. If a determination is made at 206 that the sample count does not exceed the threshold, however, the method 200 proceeds to 216.

At 208, timestamp information is stored and the buffered sample data is discarded, e.g., not moved to a memory. At 210, a determination is made as to whether a sample data point of the analog input signal leaves the vertical range, e.g., whether a magnitude corresponding to the analog input signal(s) crosses a specified vertical threshold. If the determination is that the sample data point has not left the vertical range, the buffered sample data point is discarded, as indicated at 214, the sample count is incremented, and the method 200 returns to 210. If a determination is made that the sample data point has indeed left the vertical range, however, the buffered sample data may be stored, e.g., moved to a memory, and timestamp information may also be stored. In this way, the method 200 may use the buffered sample data to capture important data points adjacent to a point when the analog input signal leaves the vertical range. The method 200 then returns to 202.

At 216, a determination is made as to whether any of the sample data leaves the vertical range. If a determination is made that the sample data has not left the vertical range, the sample data will continue to be temporarily stored, e.g., buffered, and the sample count is incremented, as indicated at 220, and the method returns to 206. If a determination is made that the sample data has indeed left the vertical range, however, the buffered data may be stored, e.g., moved to a memory, as indicated at 218. Also at 218, the timestamp information corresponding to the transition may be stored. However, timestamp information is not required to be stored at 218 since the timing information may be determined from the stored buffered data. The method 200 then returns to 202.

Figure 3:
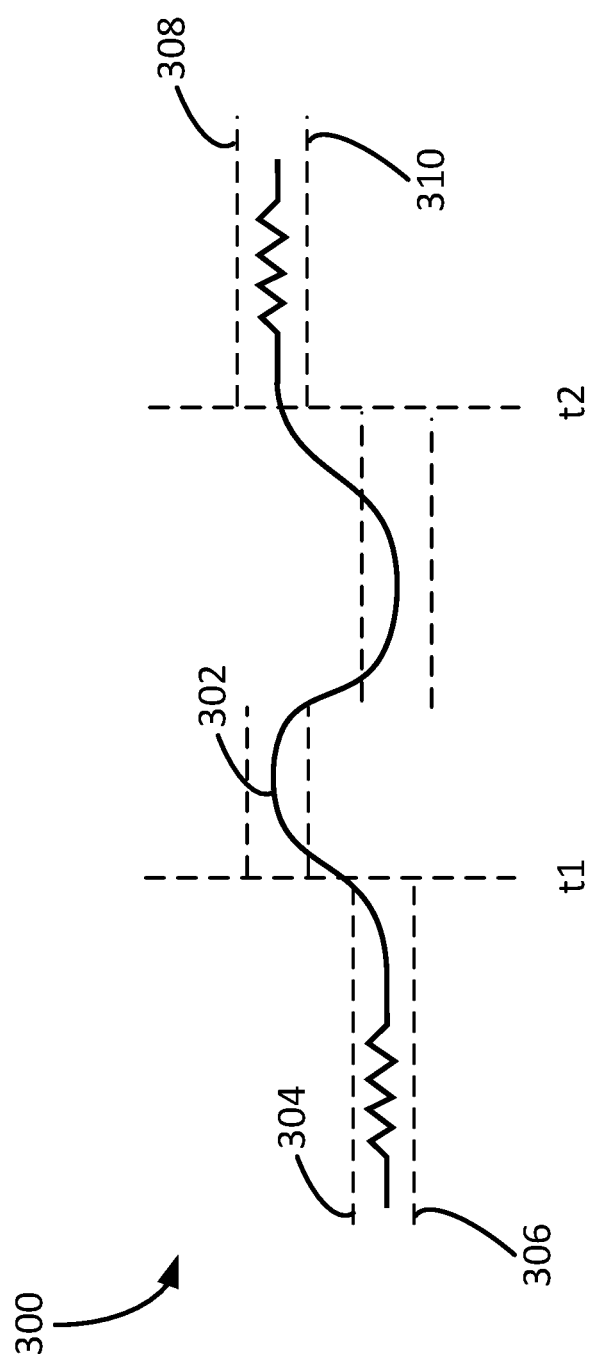
FIG. 3 is a diagram illustrating an example of a vertical range being reset responsive to an analog input signal transitioning in accordance with certain embodiments of the disclosed technology.

FIG. 3 is a diagram illustrating an example 300 of a vertical range being reset responsive to an analog input signal 302 transitioning in accordance with certain embodiments of the disclosed technology. In the example 300, an initial vertical range is established by way of two vertical thresholds 304 and 306. In certain embodiments, the vertical thresholds 304 and 306 may be implemented by respective comparators. Initially, the analog input signal 302 remains within the vertical range, e.g., the magnitude of the signal 302 does not cross either of the thresholds 304 and 306. At time t1, however, the signal 302 transitions in that it leaves the vertical range. Here, the magnitude of the signal 302 crosses the upper threshold 304. As the signal 302 transitions, the vertical range is reset accordingly. Starting at time t2, the signal 302 stabilizes and the vertical range is reset, e.g., by moving the vertical thresholds 304 and 306 upward to new values. The vertical range may be defined based at least in part on an offset from the signal 302.

Figure 4:
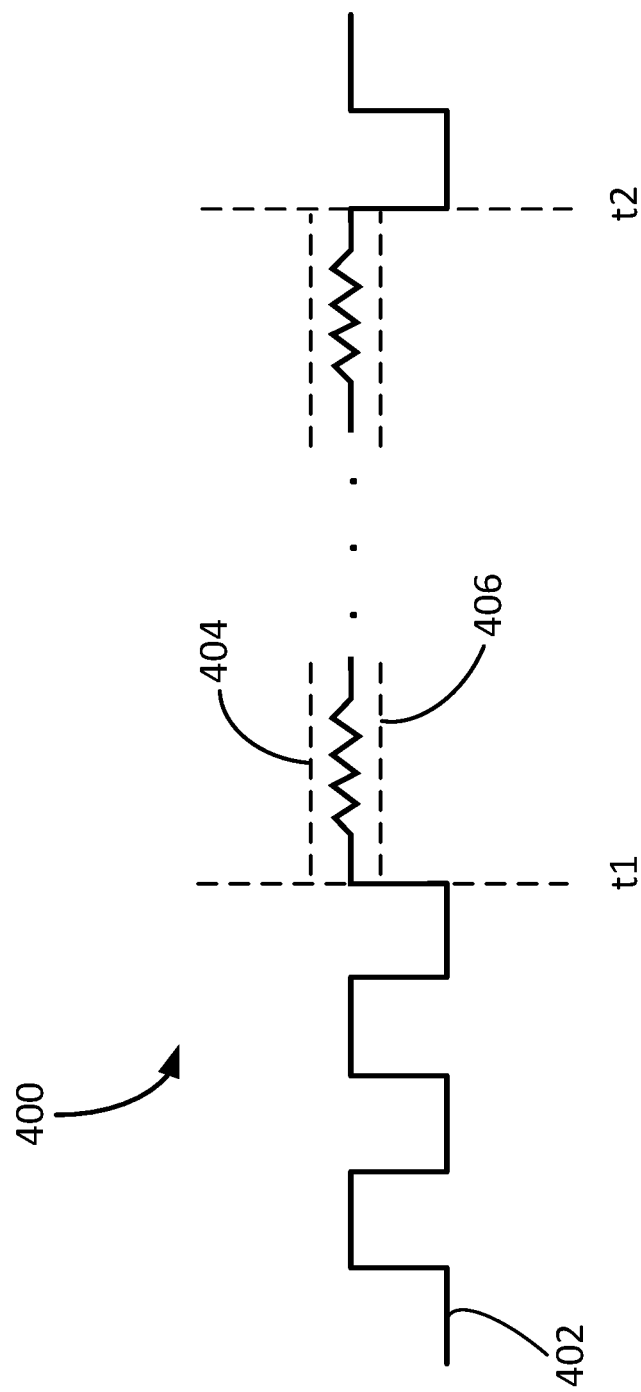
FIG. 4 is a diagram illustrating an example of an analog input signal that does not transition within a certain period of time in accordance with certain embodiments of the disclosed technology.

FIG. 4 is a diagram illustrating an example 400 of an analog input signal 402 that does not transition within a certain period of time in accordance with certain embodiments of the disclosed technology. In the example 400, the analog input signal 402 remains relatively static beginning at time t2, at which time a vertical range is established by way of two vertical thresholds 404 and 406 that may be implemented by respective comparators, for example. The analog input signal 402 remains relatively static until time t2. Thus, not all of the sample data corresponding to the analog input signal 402 need be stored between times t1 and t2. In accordance with disclosed embodiments, discarding a portion of the sample data corresponding to the analog input signal 402 when it does not transition across the vertical thresholds 404 and 406 between times t1 and t2 may be used to advantageously reduce the amount of data stored between times t1 and t2.

Figure 5:
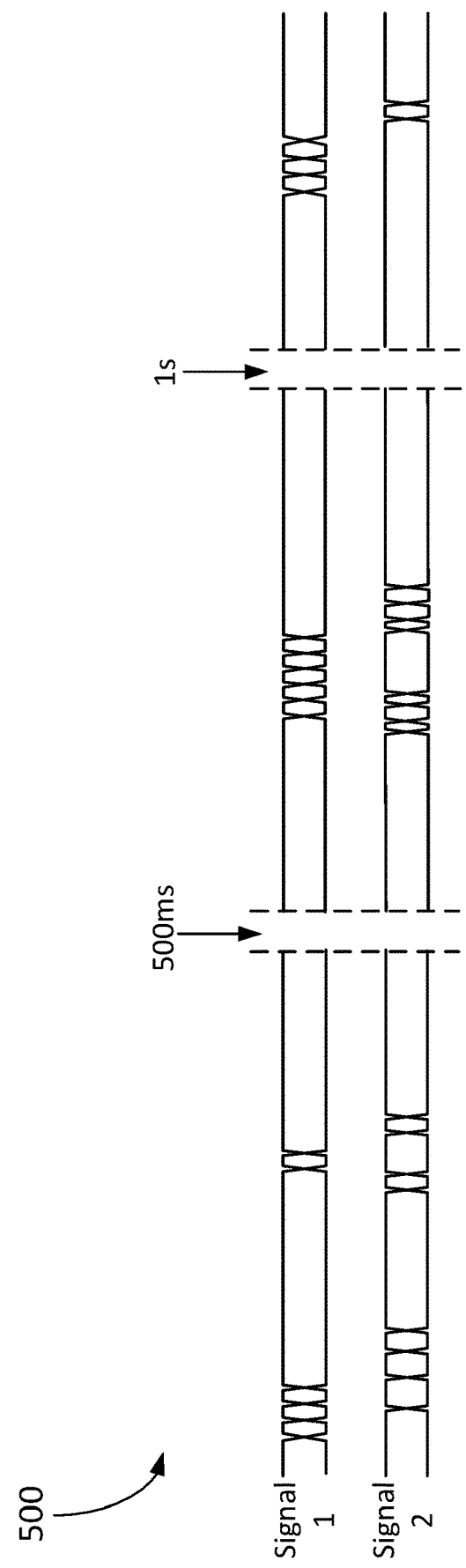
FIG. 5 is a diagram illustrating an example of low-speed serial bus signals in accordance with certain embodiments of the disclosed technology.

FIG. 5 is a diagram illustrating an example 500 of low-speed serial bus signals in accordance with certain embodiments of the disclosed technology. In the example 500, there are two signals that each have infrequent activity. Implementations of the disclosed technology may advantageously reduce the amount of sample information corresponding to the signals that is stored. For example, sample data may be discarded corresponding to the two illustrated time segments (500 ms and 1 s) during which the signals do not transition.

Figure 6:
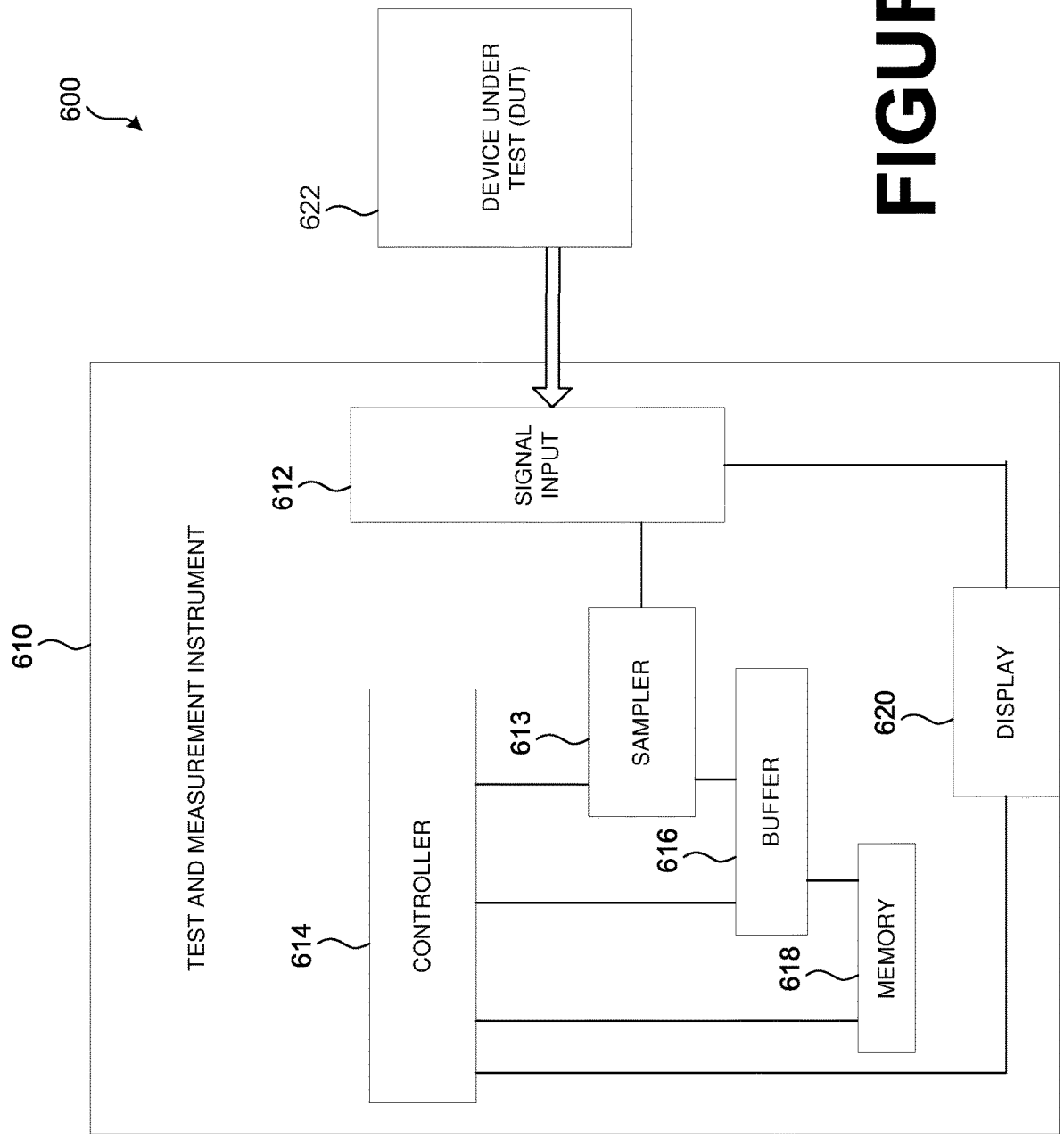
FIG. 6 is a block diagram illustrating an example of an electronic test and measurement system in accordance with certain implementations of the disclosed technology.

FIG. 6 is a block diagram illustrating an example of an electronic test and measurement system 600 in accordance with certain implementations of the disclosed technology. In the example, the system 600 includes a test and measurement instrument 610, such as an oscilloscope or digital multimeter (DMM), that includes at least one signal input 612 configured to receive one or more analog signals from a device under test (DUT) 622. The test and measurement instrument 610 also includes a sampler 613 configured to receive the analog input signal(s) from the signal input 612 and produce sample data that can be temporarily stored to a buffer 616.

In the example, the test and measurement instrument 610 also includes a controller 614 that can be configured to process the one or more analog signals received from the signal input 612. For example, the controller can establish or cause to be established a vertical range such that the storing of sample data corresponding to the incoming analog signal(s) is at least partially dependent on whether any of the incoming analog signal(s) transitions out of the vertical range. In situations where the sample data transitions, the sample data may be moved to a memory 618; otherwise, the buffered data may be discarded.

In certain embodiments, the test and measurement instrument 610 also includes a display device 620. For example, the display device 620 may be configured to visually present to a user the vertical range in connection with the analog signal(s).

EXAMPLES

Illustrative examples of the technologies disclosed herein are provided below. An embodiment of the technologies may include any one or more, and any combination of, the examples described below.

Example 1 is directed to a test and measurement instrument comprising an input configured to receive an analog signal; a sampler configured to produce digital sample data corresponding to the analog signal; a buffer configured to temporarily store a portion of the sample data corresponding to the analog signal; a memory configured to store sample data from the buffer; a plurality of comparators configurable to establish a vertical range; and a controller configured to: configure the plurality of comparators to establish a first vertical range based on a first sample data in the buffer; determine whether any of the sample data in the buffer transitions outside the first vertical range during a period of time; responsive to a determination that a second sample data in the buffer transitions outside the first vertical range during the period of time, cause the sample data in the buffer to be moved to the memory, reset the period of time, and further cause the plurality of comparators to be reconfigured to establish a second vertical range based on the second sample data in the buffer; and responsive to a determination that none of the sample data in the buffer transitions outside the first vertical range during the period of time, cause the sample data in the buffer to be discarded and reset the period of time.

Example 2 includes the subject matter of claim 1, wherein the plurality of comparators are configured to establish either or both of an upper threshold and a lower threshold.

Example 3 includes the subject matter of any of claims 1-2, wherein the controller is further configured to cause timestamp information to be stored, the timestamp information corresponding to when the second sample data transitions outside the vertical range.

Example 4 includes the subject matter of any of claims 1-3, the test and measurement instrument further comprising a display device, wherein the controller is further configured to display a waveform on the display device, the waveform being reconstructed from the sample data stored in the memory and the stored timestamp information.

Example 5 includes the subject matter of any of claims 1-4, wherein the controller is further configured to cause timestamp information to be stored, the timestamp information corresponding to the sample data in the buffer being discarded.

Example 6 includes the subject matter of claim 5, the test and measurement instrument further comprising a display device, wherein the controller is further configured to display a waveform on the display device, the waveform being reconstructed from the sample data stored in the memory and the stored timestamp information.

Example 7 includes the subject matter of any of claims 1-6, wherein the vertical range is configured to be set by a user.

Example 8 includes the subject matter of any of claims 1-7, wherein the controller includes one or both of a processor and a state machine.

Example 9 includes the subject matter of any of claims 1-8, the test and measurement instrument further comprising a display device, wherein the controller is further configured to cause the vertical range to be visually presented by the display device.

Example 10 is directed to a test and measurement instrument comprising: an input configured to receive an analog signal; a sampler configured to produce digital sample data corresponding to the analog signal; a buffer configured to temporarily store a portion of the sample data corresponding to the analog signal; a memory configured to store sample data from the buffer; a plurality of comparators configurable to establish a vertical range; and a controller configured to: determine whether any of the sample data in the buffer transitions outside the vertical range during a period of time; responsive to a determination that the sample data in the buffer transitions outside the vertical range during the period of time, cause the sample data in the buffer to be moved to the memory and reset the period of time; and responsive to a determination that none of the sample data in the buffer transitions outside the vertical range during the period of time, cause the sample data in the buffer to be discarded and reset the period of time.

Example 11 includes the subject matter of claim 10, wherein the plurality of comparators are configured to establish either or both of an upper threshold and a lower threshold for each of the one or more channels.

Example 12 includes the subject matter of any of claims 10-11, wherein the controller is further configured to cause timestamp information to be stored, the timestamp information corresponding to when the at least one of the one or more analog signals transitions outside the vertical range.

Example 13 includes the subject matter of any of claim 12, the test and measurement instrument further comprising a display device, wherein the controller is further configured to display a waveform on the display device, the waveform being reconstructed from the sample data stored in the memory and the stored timestamp information.

Example 14 includes the subject matter of any of claims 10-13, wherein the controller is further configured to cause timestamp information to be stored, the timestamp information corresponding to the sample data in the buffer being discarded.

Example 15 includes the subject matter of any of claims 10-14, the test and measurement instrument further comprising a display device, wherein the controller is further configured to cause the vertical range to be visually presented by the display device.

Example 16 is directed to a machine-implemented method, and includes receiving an analog signal; producing digital sample data corresponding to the analog signal; temporarily storing a portion of the sample data corresponding to the analog signal; establishing a first vertical range; determining whether any of the sample data transitions outside the first vertical range during a period of time; responsive to a determination that a second sample data in the buffer transitions outside the first vertical range during the period of time, causing the temporarily-stored sample data to be moved to a memory, resetting the period of time, and further establishing a second vertical range based on the second sample data; and responsive to a determination that none of the sample data in the buffer transitions outside the first vertical range during the period of time, causing the temporarily-stored sample data to be discarded and resetting the period of time.

Example 17 includes the subject matter of claim 16, wherein the vertical range includes one or more vertical thresholds.

Example 18 includes the subject matter of any of claims 16-17, the method further comprising storing timestamp information corresponding to when the sample data transitions outside the vertical range.

Example 19 includes the subject matter of any of claims 16-18, the method further comprising storing timestamp information corresponding to the sample data being discarded.

Example 20 includes the subject matter of any of claims 16-19, the method further comprising visually presenting the vertical range on a display device.

Computer-readable media means any media that can be accessed by a computing device. By way of example, and not limitation, computer-readable media may comprise computer storage media and communication media.

Computer storage media means any medium that can be used to store computer-readable information. By way of example, and not limitation, computer storage media may include random access memory (RAM), read-only memory (ROM), electrically erasable programmable read-only memory (EEPROM), flash memory or other memory technology, compact disk read-only memory (CD-ROM), digital video disk (DVD) or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, radio frequency (RF), infrared, acoustic or other types of signals.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A test and measurement instrument, comprising:
an input configured to receive an analog signal;
a sampler configured to produce digital sample data corresponding to the analog signal;
a buffer configured to temporarily store a portion of the sample data corresponding to the analog signal;
a memory configured to store sample data from the buffer;
a plurality of comparators configurable to establish a vertical range; and
a controller configured to:
configure the plurality of comparators to establish a first vertical range based on a first sample data in the buffer;
determine whether any of the sample data in the buffer transitions outside the first vertical range during a period of time;
responsive to a determination that a second sample data in the buffer transitions outside the first vertical range during the period of time, cause the sample data in the buffer to be moved to the memory, reset the period of time, and further cause the plurality of comparators to be reconfigured to establish a second vertical range based on the second sample data in the buffer; and
responsive to a determination that none of the sample data in the buffer transitions outside the first vertical range during the period of time, cause the sample data in the buffer to be discarded and reset the period of time.

2. The test and measurement instrument of claim 1, wherein the plurality of comparators are configured to establish either or both of an upper threshold and a lower threshold.

3. The test and measurement instrument of claim 1, wherein the controller is further configured to cause timestamp information to be stored, the timestamp information corresponding to when the second sample data transitions outside the first vertical range.

4. The test and measurement instrument of claim 3, further comprising a display device, wherein the controller is further configured to display a waveform on the display device, the waveform being reconstructed from the sample data stored in the memory and the stored timestamp information.

5. The test and measurement instrument of claim 1, wherein the controller is further configured to cause timestamp information to be stored, the timestamp information corresponding to the sample data in the buffer being discarded.

6. The test and measurement instrument of claim 5, further comprising a display device, wherein the controller is further configured to display a waveform on the display device, the waveform being reconstructed from the sample data stored in the memory and the stored timestamp information.

7. The test and measurement instrument of claim 1, wherein at least one of the first vertical range and the second vertical range is configured to be set by a user.

8. The test and measurement instrument of claim 1, wherein the controller includes one or both of a processor and a state machine.

9. The test and measurement instrument of claim 1, further comprising a display device, wherein the controller is further configured to cause at least one of the first vertical range and the second vertical range to be visually presented by the display device.

10. A test and measurement instrument, comprising:
an input configured to receive one or more analog signals on each of one or more channels;
a buffer configured to temporarily store sample data corresponding to each of the one or more analog signals;
a memory configured to store sample data from the buffer;
a plurality of comparators configured to establish a vertical range;
a controller configured to:
determine whether any of the one or more analog signals transitions outside the vertical range during a period of time;

responsive to a determination that at least one of the one or more analog signals transitions outside the vertical range during the period of time, cause the sample data in the buffer to be moved to the memory and reset the period of time; and responsive to a determination that none of the one or more analog signals transitions outside the vertical range during the period of time, cause the sample data in the buffer to be disregarded and reset the period of time.

11. The test and measurement instrument of claim 10, wherein the plurality of comparators are configured to establish either or both of an upper threshold and a lower threshold for each of the one or more channels.

12. The test and measurement instrument of claim 10, wherein the controller is further configured to cause timestamp information to be stored, the timestamp information corresponding to when the at least one of the one or more analog signals transitions outside the vertical range.

13. The test and measurement instrument of claim 12, further comprising a display device, wherein the controller is further configured to display one or more waveforms on the display device, the one or more waveforms being reconstructed from the sample data stored in the memory and the stored timestamp information.

14. The test and measurement instrument of claim 10, wherein the controller is further configured to cause timestamp information to be stored, the timestamp information corresponding to the sample data in the buffer being disregarded.

15. The test and measurement instrument of claim 10, further comprising a display device, wherein the controller is further configured to cause the vertical range to be visually presented by the display device.

16. A machine-implemented method, comprising:
receiving an analog signal;
producing digital sample data corresponding to the analog signal;
temporarily storing, in a buffer, a portion of the sample data corresponding to the analog signal;
establishing a first vertical range based on a first sample data;
determining whether any of the sample data transitions outside the first vertical range during a period of time;
responsive to a determination that a second sample data in the buffer transitions outside the first vertical range during the period of time, causing the temporarily-stored sample data to be moved to a memory, resetting the period of time, and further establishing a second vertical range based on the second sample data; and
responsive to a determination that none of the sample data in the buffer transitions outside the first vertical range during the period of time, causing the temporarily-stored sample data to be discarded and resetting the period of time.

17. The machine-implemented method of claim 16, wherein each of the first vertical range and the second vertical range includes one or more vertical thresholds.

18. The machine-implemented method of claim 16, further comprising storing timestamp information corresponding to when the second sample data transitions outside the first vertical range.

19. The machine-implemented method of claim 16, further comprising storing timestamp information corresponding to the sample data being discarded.

20. The machine-implemented method of claim 16, further comprising visually presenting the first vertical range or the second vertical range on a display device.

* * * * *